(12) United States Patent
Suzuki

(10) Patent No.: US 11,964,334 B2
(45) Date of Patent: Apr. 23, 2024

(54) TECHNIQUE FOR MEASURING ELECTRIC CURRENT FLOWING IN ELECTRIC POWERED WORK MACHINE

(71) Applicant: MAKITA CORPORATION, Anjo (JP)

(72) Inventor: Hitoshi Suzuki, Anjo (JP)

(73) Assignee: MAKITA CORPORATION, Anjo (JP)

( * ) Notice: Subject to any disclaimer, the term of this patent is extended or adjusted under 35 U.S.C. 154(b) by 414 days.

(21) Appl. No.: 17/510,846

(22) Filed: Oct. 26, 2021

(65) Prior Publication Data
US 2022/0131442 A1    Apr. 28, 2022

(30) Foreign Application Priority Data

Oct. 26, 2020 (JP) .................................. 2020-178979

(51) Int. Cl.
| | | |
|---|---|---|
| B23D 47/12 | (2006.01) | |
| B23D 45/00 | (2006.01) | |
| B23D 45/16 | (2006.01) | |
| B25F 5/02 | (2006.01) | |
| H02K 7/14 | (2006.01) | |
| H02K 11/33 | (2016.01) | |
| H03F 3/45 | (2006.01) | |

(52) U.S. Cl.
CPC ............. *B23D 47/12* (2013.01); *B23D 45/00* (2013.01); *B23D 45/16* (2013.01); *H02K 7/14* (2013.01); *H02K 11/33* (2016.01); *H03F 3/45475* (2013.01); *B25F 5/02* (2013.01)

(58) Field of Classification Search
CPC ......... B23D 47/12; B23D 45/00; B23D 45/16
See application file for complete search history.

(56) References Cited

U.S. PATENT DOCUMENTS

| | | | | |
|---|---|---|---|---|
| 5,014,793 A | * | 5/1991 | Germanton | ............... H02P 1/18 |
| | | | | 81/473 |
| 5,289,101 A | * | 2/1994 | Furuta | ...................... H02J 7/02 |
| | | | | 363/21.09 |

(Continued)

FOREIGN PATENT DOCUMENTS

| | | | |
|---|---|---|---|
| CN | 201789042 U | * | 4/2011 |
| CN | 103795247 A | * | 5/2014 |

(Continued)

OTHER PUBLICATIONS

JP2022073082A translation (Year: 2022).*

(Continued)

*Primary Examiner* — Jonathan G Riley
(74) *Attorney, Agent, or Firm* — Oliff PLC

(57) ABSTRACT

An electric powered work machine according to one aspect of the present disclosure includes: a tool; a motor; a manual switch; an electric current path; a shunt resistor; a reference voltage generation circuit; and an electric current measurement circuit. The reference voltage generation circuit (i) generates a reference voltage having a first magnitude in response to a first condition being established, and (ii) generates the reference voltage having a second magnitude in response to the first condition not being established. The electric current measurement circuit (i) receives the reference voltage and a measured voltage, and (ii) outputs an output voltage based on the reference voltage and the measured voltage.

20 Claims, 7 Drawing Sheets

(56) References Cited

U.S. PATENT DOCUMENTS

| | | | |
|---|---|---|---|
| 2008/0252242 A1* | 10/2008 | Akama | H02P 6/12 318/400.14 |
| 2010/0084150 A1* | 4/2010 | Suzuki | H01M 50/543 173/217 |
| 2010/0085022 A1* | 4/2010 | Shimizu | H02J 7/04 320/162 |
| 2013/0135047 A1* | 5/2013 | Danioni | H03F 3/45475 330/252 |
| 2018/0238940 A1* | 8/2018 | Sugisawa | G01R 19/257 |
| 2019/0036330 A1* | 1/2019 | Becker | H02H 9/008 |
| 2019/0131899 A1* | 5/2019 | Kuragano | H02K 9/04 |
| 2022/0131442 A1* | 4/2022 | Suzuki | H02P 6/28 |
| 2022/0131486 A1* | 4/2022 | Suzuki | H02P 27/08 |

FOREIGN PATENT DOCUMENTS

| | | | | |
|---|---|---|---|---|
| CN | 112688536 A | * | 4/2021 | H02M 1/08 |
| DE | 102021127664 A1 | * | 4/2022 | B23D 45/16 |
| JP | 2008283787 A | * | 11/2008 | H02M 1/32 |
| JP | 2010148289 A | * | 7/2010 | |
| JP | 2019-123027 A | | 7/2019 | |
| JP | 2019123027 A | * | 7/2019 | |
| JP | 6562798 B2 | * | 8/2019 | |
| JP | 2021086741 A | * | 6/2021 | |
| JP | 2022073082 A | * | 5/2022 | |
| WO | WO-2023174613 A1 | * | 9/2023 | |

OTHER PUBLICATIONS

JP2021086741A Translation (Year: 2021).*
JP6562798B2—translation (Year: 2019).*
JP2010148289A Translation (Year: 2010).*
CN103795247A (Year: 2014).*
JP2019123027A Translation (Year: 2019).*
CN201789042U (Year: 2011).*
CN112688536A Translation (Year: 2021).*
JP2008283787 Translation (Year: 2008).*
DE102021127664 translation. (Year: 2022).*

* cited by examiner

TECHNIQUE FOR MEASURING ELECTRIC CURRENT FLOWING IN ELECTRIC POWERED WORK MACHINE

CROSS-REFERENCE TO RELATED APPLICATION

The present application claims the benefit of Japanese Patent Application No. 2020-178979 filed on Oct. 26, 2020 with the Japan Patent Office, the entire disclosure of which is incorporated herein by reference.

BACKGROUND

The present disclosure relates to an electric powered work machine.

Japanese Unexamined Patent Application Publication No. 2019-123027 discloses an electric powered work machine including an electric current measurement circuit. The electric current measurement circuit measures a voltage across a resistor that is serially connected to a current path on a negative electrode side of a motor in the electric powered work machine, to thereby measure a magnitude of an electric current supplied to the motor.

SUMMARY

Electric powered work machines may require high reliability for current measurement in some cases. In such cases, the electric powered work machines may include two different independent electric current measurement circuits and may be configured to compare two electric current values that are measured by the two electric current measurement circuits in order to ensure high reliability.

However, mounting two electric current measurement circuits may require additional components and an increased footprint for the additional components in an electric powered work machine.

In one aspect of the present disclosure, it is preferable to measure an electric current flowing in an electric powered work machine with high reliability without an additional electric current measurement circuit.

One aspect of the present disclosure provides an electric powered work machine including: a tool; a motor; a manual switch; an electric current path; a shunt resistor; a reference voltage generation circuit; and an electric current measurement circuit.

The motor generates a driving force for driving the tool. The electric current path (i) connects a power supply with the motor in response to the manual switch being manually operated, and (ii) disconnects the power supply from the motor in response to the manual switch not being manually operated. The shunt resistor is on the electric current path.

The reference voltage generation circuit (i) generates a reference voltage having a first magnitude (or a first value) in response to a first condition being established, and (ii) generates the reference voltage having a second magnitude (or a second value) in response to the first condition not being established. The first magnitude and the second magnitude are different (or distinct) from zero volts. The first magnitude is different from the second magnitude.

The electric current measurement circuit (i) receives the reference voltage and a measured voltage, and (ii) outputs an output voltage based on the reference voltage and the measured voltage. The measured voltage is generated across the shunt resistor in response to an electric current flowing through the shunt resistor. The output voltage is consistent with the reference voltage in response to the electric current not flowing through the shunt resistor (or in response to no electric current flowing through the shunt resistor).

In the electric powered work machine configured as described above, (i) a magnitude of the reference voltage is set to the second magnitude in response to the first condition being not established, and (ii) the magnitude of the reference voltage is varied (or changed or controlled or adjusted) from the second magnitude to the first magnitude in response to the first condition being established. In response to such variation in the magnitude of the reference voltage, the magnitude of the output voltage of the electric current measurement circuit varies. Based on no variation in the output voltage, the electric current measurement circuit can be determined non-faulty. Accordingly, it is not necessary for the electric powered work machine to include two independent electric current measurement circuits to ensure a high reliability required for electric current measurement. Moreover, the reference voltage generation circuit can be simplified.

This enables the electric powered work machine to measure an electric current flowing in the electric powered work machine with high reliability without an additional electric current measurement circuit. As a result, additional components and an increased footprint for the additional components are not required in the electric powered work machine.

In one embodiment, the tool, the motor, the manual switch, the electric current path, the shunt resistor, the reference voltage generation circuit or the electric current measurement circuit may be omitted.

The first magnitude may be greater than the second magnitude. With such first magnitude, the output voltage of the electric current measurement circuit can be made greater than the output voltage when an electric current is actually flowing through the shunt resistor, even in a case where the reference voltage is varied due to some cause during the motor rotating.

This makes it possible to suppress an inaccurate measurement in which a value of the electric current flowing through the motor is measured lower than the actual value, in a case where there is a faulty that the reference voltage is varied during the motor rotating.

The electric powered work machine may include a diagnosis circuit for electric current measurement. The diagnosis circuit for electric current measurement may diagnose the electric current measurement circuit based on the output voltage during the first condition being established.

This enables the electric powered work machine to suppress occurrence of a trouble that a diagnosis for the electric current measurement circuit is performed despite the diagnosis being unable to be properly performed. Thus, the electric powered work machine can provide a more accurate diagnosis for the electric current measurement circuit.

The diagnosis circuit for electric current measurement may determine the electric current measurement circuit non-faulty in response to a magnitude of the output voltage being consistent with the first magnitude. The diagnosis circuit for electric current measurement may determine the electric current measurement circuit faulty in response to the magnitude of the output voltage not being consistent with the first magnitude. The electric powered work machine configured as described above can determine whether the electric current measurement circuit is non-faulty or faulty.

The diagnosis circuit for electric current measurement may suspend (or stop) diagnosing the electric current measurement circuit in response to the manual switch being manually operated during the diagnosis circuit for electric current measurement diagnosing the electric current measurement circuit.

The electric powered work machine configured as described above can suppress a diagnosis of the electric current measurement circuit to be continued in a case where the situation changes to the one in which the diagnosis cannot be performed during the diagnosis of the electric current measurement circuit. Thus, the electric powered work machine can provide a more accurate diagnosis of the electric current measurement circuit.

The electric powered work machine may include an overcurrent detection circuit. The overcurrent detection circuit may detect an overcurrent flowing through the shunt resistor in response to the output voltage being equal to or greater than a preset threshold. The preset threshold may correspond to a minimum value of the output voltage as the overcurrent is flowing through the shunt resistor. The preset threshold may be smaller than the first magnitude.

The electric powered work machine configured as described above can determine whether an overcurrent flows through the motor.

The overcurrent detection circuit may include a signal output circuit and a latch circuit. The signal output circuit may output an overcurrent signal in response to the output voltage being equal to or greater than the preset threshold. The overcurrent signal may indicate that the overcurrent detection circuit is detecting the overcurrent. The latch circuit may maintain the overcurrent signal output from the signal output circuit during the manual switch being manually operated.

The electric powered work machine configured as described above can notify of occurrence of the overcurrent with the overcurrent signal during the manual switch being manually operated after detecting the overcurrent.

The electric powered work machine may include a simulative signal output circuit. The simulative signal output circuit may output a simulative switch-on signal (or a pseudo switch-on signal or a false switch-on signal) to the latch circuit in response to the overcurrent detection circuit detecting the overcurrent. The simulative switch-on signal may simulatively (or falsely or artificially) indicate that the manual switch is manually operated.

The electric powered work machine configured as above outputs the simulative switch-on signal, to thereby notify of occurrence of the overcurrent even after the manual operation of the manual switch is finished.

The electric powered work machine may include a diagnosis circuit for overcurrent detection. The diagnosis circuit for overcurrent detection may diagnose the overcurrent detection circuit during the first condition being established.

In other words, the magnitude of the output voltage from the electric current measurement circuit becomes greater than the preset threshold in response to (i) the first condition being established, and (ii) the reference voltage generation circuit generating the reference voltage having the first magnitude. This causes the overcurrent detection circuit to determine that the overcurrent is detected. Thus, the electric powered work machine can perform a first diagnosis of the electric current measurement circuit and a second diagnosis of the overcurrent detection circuit simultaneously, in response to the magnitude of the reference voltage being varied or having been varied. The first diagnosis may include a determination on whether the electric current measurement circuit properly operates. The second diagnosis may include a determination on whether the overcurrent detection circuit properly operates.

Moreover, the electric powered work machine as described above may determine that the overcurrent is detected in a case that there is a faulty that the magnitude of the reference voltage is varied during the motor rotating. This enables the electric powered work machine to inhibit the motor from keeping rotating while there is a faulty that the reference voltage is varied.

The diagnosis circuit for overcurrent detection may output a simulative voltage (or a false voltage) to the overcurrent detection circuit. The simulative voltage may be greater than the preset threshold. The diagnosis circuit for overcurrent detection may determine whether the overcurrent detection circuit detects the overcurrent in response to the simulative voltage being output.

The diagnosis circuit for overcurrent detection as described above can determine whether the overcurrent detection circuit can appropriately detect the overcurrent by outputting the simulative voltage to the overcurrent detection circuit.

The electric current measurement circuit may amplify the measured voltage received by the electric current measurement circuit. The electric current measurement circuit configured as described above can appropriately measure an electric current based on the measured voltage amplified, even in a case where the measured voltage is weak.

The electric current measurement circuit may include a differential amplification circuit (or a differential amplifier or a difference amplifier) configured to amplify the measured voltage received by the electric current measurement circuit. The electric current measurement circuit configured as above can cancel a noise component included in the measured voltage with the differential amplification circuit. The differential amplification circuit may include any configuration to amplify the measured voltage, and may include an operational amplifier, for example The differential amplification circuit may have a first gain. The operational amplifier may have an open-loop gain of its own. The first gain may be smaller than the open-loop gain. The differential amplification circuit configured as described above can reproduce an input waveform with the operational amplifier.

The output voltage may correspond to a sum of (i) the reference voltage received by the electric current measurement circuit, and (ii) the measured voltage amplified by the electric current measurement circuit. This enables the electric current measurement circuit to vary the magnitude of the output voltage in response to the variation in the reference voltage.

The reference voltage generation circuit may include: a first resistor; a second resistor; a reference voltage output terminal; and a switch. The second resistor may be serially connected to the first resistor.

The reference voltage output terminal may be connected to a connection point (or, a node) between the first resistor and the second resistor. The reference voltage output terminal may output the reference voltage.

The switch may be connected in parallel with the first resistor. The switch may (i) shift (or switch) to a non-conductive state in response to the first condition not being established, and (ii) shift to a conductive state in response to the first condition being established.

The reference voltage generation circuit as described above outputs a voltage equivalent to the voltage at the connection point between the first resistor and the second resistor, as the reference voltage. The reference voltage generation circuit can output the reference voltage with a low output impedance from the reference voltage output terminal.

Alternatively, the reference voltage generation circuit may include: a first resistor; a second resistor; a resistance value varying circuit; and a voltage buffer. The second resistor may be serially connected with the first resistor. The resistance value varying circuit may be connected in parallel with the first resistor. The resistance value varying circuit may include a third resistor and a switch that is serially connected with the third resistor. The switch may (i) shift to a non-conductive state in response to the first condition not being established, and (ii) shift to a conductive state in response to the first condition being established.

The reference voltage generation circuit as described above may output a voltage equivalent to the voltage at the connection point between the first resistor and the second resistor, as the reference voltage. The reference voltage generation circuit can output the reference voltage with a low output impedance from the reference voltage output terminal. The reference voltage generation circuit may adjust the resistance value of the third resistor, to thereby adjust the magnitude of the reference voltage while the switch is in the conductive state.

The voltage buffer may include a unity gain buffer (or a voltage follower).

The unity gain buffer may include an operational amplifier including a non-inverting input terminal, an inverting input terminal, and an output terminal. The non-inverting input terminal may be connected to the connection point between the first resistor and the second resistor. The inverting input terminal may be connected to the output terminal.

The electric powered work machine may include a computer. The computer may include an output port. The output port may output an analog-formed voltage signal to the reference voltage generation circuit. The analog-formed voltage signal may have a first level or a second level. The first level may be different (or distinct) from the second level.

The computer may (i) set the analog-formed voltage signal to the first level in response to the first condition not being established, and (ii) set the analog-formed voltage signal to the second level in response to the first condition being established.

With the analog-formed voltage signal, the computer can vary the magnitude of the reference voltage that is output from the reference voltage generation circuit.

The first condition may be established in any situation, and may be established, for example, at least in response to the manual switch not being manually operated. This enables the electric powered work machine to generate the reference voltage having the first magnitude in response to the manual switch not being manually operated.

Yet another aspect of the present disclosure provides a method including:
  conducting an electric current path in response to a manual switch of an electric powered work machine being manually operated, the electric current path connecting a power supply with a motor of the electric powered work machine;
  interrupting the electric current path in response to the manual switch not being manually operated;
  generating a reference voltage having a first magnitude in response to a first condition being established, the first magnitude being different from zero volts,
  generating the reference voltage having a second magnitude in response to the first condition not being established, the second magnitude (i) being different from zero volts and (ii) being different (or distinct) from the first magnitude; and
  outputting an output voltage based on the reference voltage and a measured voltage, the measured voltage being generated across a shunt resistor on the electric current path in response to an electric current flowing through the shunt resistor, and the output voltage being consistent with the reference voltage in response to the electric current not flowing through the shunt resistor (or no electric current flowing through the shunt resistor).

According to the method described above, it is possible to measure an electric current flowing through the electric powered work machine with high reliability without an additional electric current measurement circuit.

BRIEF DESCRIPTION OF THE DRAWINGS

Embodiments of the present disclosure will be described hereinafter by way of example with reference to the accompanying drawings, in which.

DETAILED DESCRIPTION OF EXEMPLARY EMBODIMENTS

1. First Embodiment

[1-1. Overall Configuration]

Figure 1:
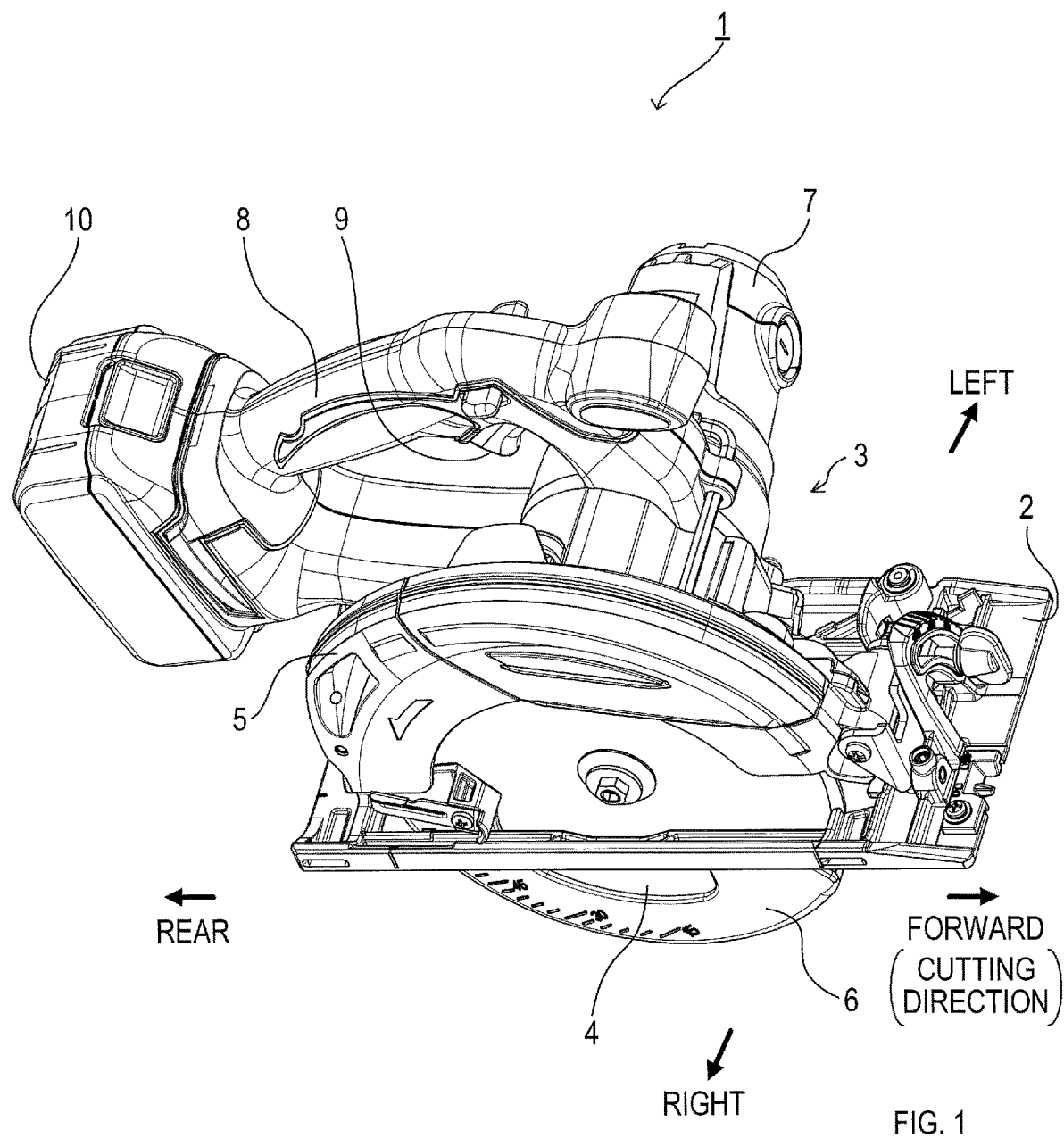
FIG. 1 is a perspective view showing an overall configuration of an electric powered work machine.

As shown in FIG. 1, an electric powered work machine 1 of a first embodiment is in a form of an electric powered circular saw. The electric powered circular saw is used for cutting workpieces.

The electric powered work machine 1 includes: a base 2; and a main-body part 3. The base 2 is a member having a rectangular shape. The base 2 comes into contact with an upper surface of a workpiece in response to the electric powered work machine 1 cutting the workpiece. The main-body part 3 is disposed on an upper surface side of the base 2.

The main-body part 3 includes: a saw blade 4; a saw-blade case 5; and a cover 6. The saw blade 4 has a circular shape. The saw blade 4 is disposed on a right side of the main-body part 3 in a cutting-travel direction. The saw-blade case 5 covers (or houses) an upper side of the saw blade 4. That is, the saw-blade case 5 internally houses (or covers) a first circumferential edge of the saw blade 4. The first circumferential edge corresponds to a substantially semicircular extent of a circumferential edge of the saw blade 4.

The cover 6 covers a second circumferential edge of the saw blade 4. The second circumferential edge corresponds to a substantially semicircular extent of the circumferential edge of a lower side of the saw blade 4. The cover 6 is configured to be opened and closed. FIG. 1 shows that the cover 6 is closed. The cover 6 is opened in response to the electric powered work machine 1 cutting the workpiece. Specifically, in response to the electric powered work machine 1 being moved along the cutting-travel direction, the cover 6 rotates about a rotational shaft of the saw blade 4 in a clockwise direction in FIG. 1, whereby the cover 6 is gradually opened. Consequently, the saw blade 4 is exposed. The exposed portion proceeds to cut into the workpiece.

Figure 2:
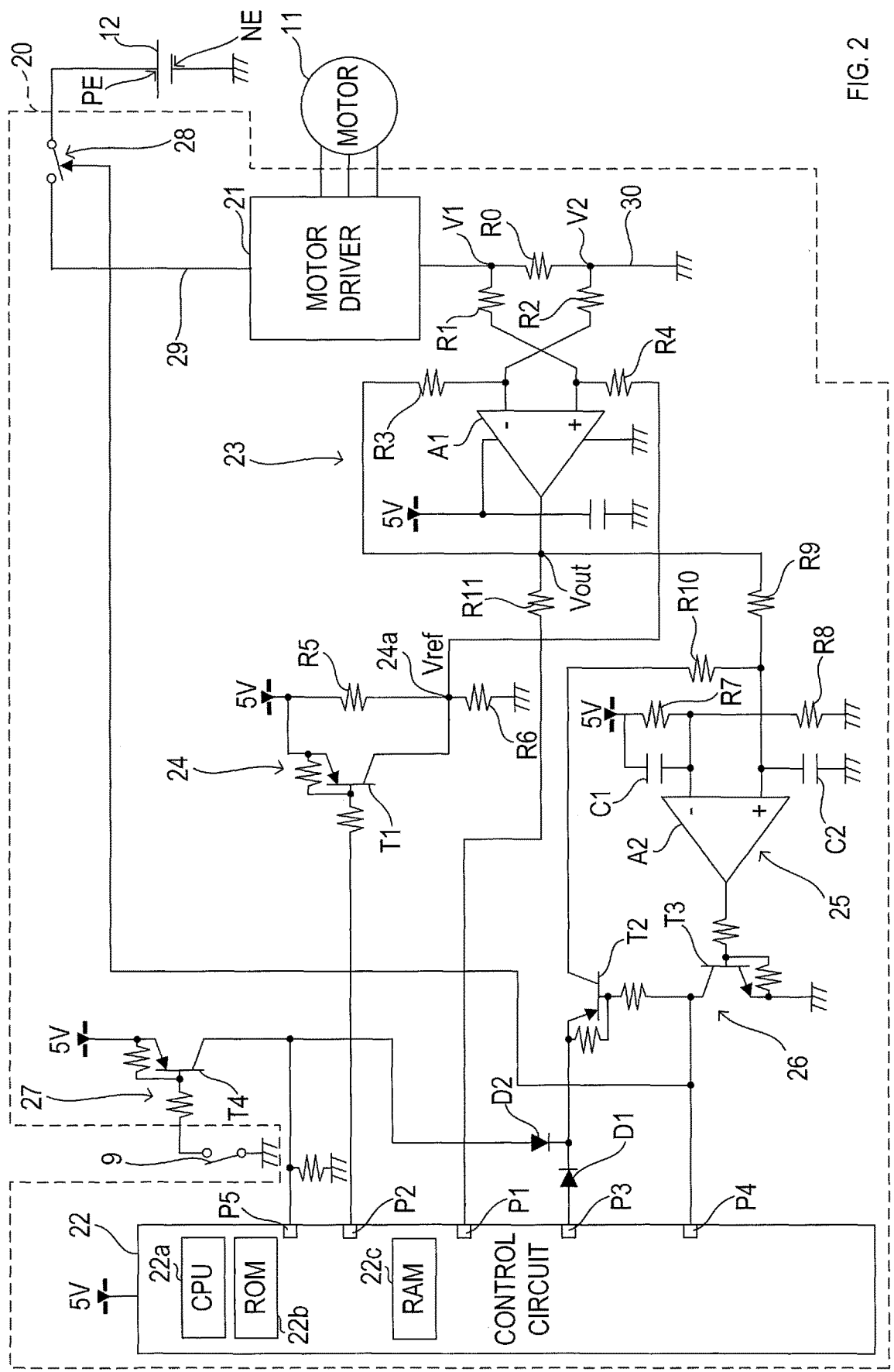
FIG. 2 is a block diagram showing an electrical configuration of the electric powered work machine.

A motor case 7 having a substantially cylindrical-shape is installed on a left side of the main-body part 3. The motor case 7 has a substantially cylindrical shape. A motor 11 is housed inside of the motor case 7. The motor 11 is a drive source of the electric powered work machine 1. It is noted that the motor 11 is not shown in FIG. 1, but is shown in FIG. 2.

A gear mechanism, which is not shown, is housed between the motor case 7 and the saw blade 4. A rotation of the motor 11 is transmitted to the saw blade 4 via the gear mechanism. In response to the rotation of the motor 11 having been transmitted to the saw blade 4, the saw blade 4 starts to rotate.

A handle 8 is disposed on an upper side of the main-body part 3. The handle 8 is gripped by a user of the electric powered work machine 1. The handle 8 is mounted, such that it exhibits an arch shape, on the upper side of the main-body part 3. That is, the handle 8 includes a first end that is fixed on a rear-end side of the main-body part 3 in the cutting-travel direction. The handle 8 includes a second end that is fixed on a front-end side of the main-body part 3 in the cutting-travel direction.

The handle 8 is provided with a trigger switch 9. The user can pull or release the trigger switch 9 while gripping the handle 8. A lock-off lever is provided near the trigger switch 9. The lock-off lever protrudes along a left-right direction of the handle 8. The user can pull the trigger switch 9 while manipulating the lock-off lever. Specifically, the user can pull the trigger switch 9 by pushing the lock-off lever from the left side or from the right side.

A battery pack 10 is detachably mounted on a rear end of the main-body part 3. The battery pack 10 houses a rechargeable battery 12. In response to the trigger switch 9 being pulled while the battery pack 10 is mounted on the main-body part 3, the motor 11 starts to rotate by an electric power of the battery 12. The battery 12 is not shown in FIG. 1, but is shown in FIG. 2.

[1-2. Control Unit]

As shown in FIG. 2, the electric powered work machine 1 includes a controller 20.

The control unit 20 is supplied with electricity from the battery 12. The control unit 20 drives and controls the motor 11. In the first embodiment, the motor 11 is a three-phase brushless motor and includes three wound wires, which are not shown in drawings. In other embodiments, the motor 11 is not limited to a three-phase brushless motor, but may be another type of motor. The motor 11 is driven by electricity supplied from the battery 12.

The controller 20 includes: a motor driver 21; a reference voltage circuit 24; an overcurrent detection circuit 25; a latch circuit 26; a switch manipulation circuit 27; an overcurrent interruption circuit 28; a power line 29; and a ground line 30.

The power line 29 is an electric current path from a positive electrode PE of the battery 12 to the motor 11, passing through the motor driver 21. The ground line 30 is an electric current path from a negative electrode NE of the battery 12 to the motor 11, passing through a ground and the motor driver 21.

The motor driver 21 is supplied with an electric power from the battery 12 via the power line 29 and the ground line 30. The motor driver 21 is provided for applying current to the wound wires of the motor 11. In the first embodiment, the motor driver 21 includes a three-phase full-bridge circuit having six switching devices (or electronic switches or semiconductor switches) such as field-effect transistors (FETs), bipolar transistors, or insulated-gate bipolar transistors (IGBTs), which is not shown in the drawings.

The motor driver 21 turns on or off the switching devices in the motor driver 21 depending on control signals delivered from the control circuit 22. The motor driver 21 turns the switching devices on or off, to thereby supply electric current to the wound wires of the motor 11 and then to rotate the motor 11.

The control unit 20 includes a control circuit 22. The control circuit 22 in the first embodiment is in a form of a microcomputer including a CPU 22a, a ROM 22b, a RAM 22c and others. In the control circuit 22, various functions are achieved by the CPU 22a executing a program stored in a non-transitory tangible storage medium. In the first embodiment, the ROM 22b corresponds to one example of the non-transitory tangible storage medium. Execution of the program stored in the ROM 22b enables execution of a method corresponding to the program. The control circuit 22 may include an additional microcomputer.

The control circuit 22 is not limited to a microcomputer. In another embodiment, a part of or the entire of the functions executed by the CPU 22a may be achieved by one or two or more hardware. The control circuit 22 may include a logic circuit including two or more electrical components instead of the microcomputer or in addition to the microcomputer. The control circuit 22 may include, for example, an application specific integrated circuit (ASIC) and/or an application specific standard product (ASSP). The control circuit 22 may include a programmable logic device, which can configure an arbitrary logic circuit(s), Examples of such a programmable logic device include a field programmable gate array (FPGA).

The control unit 20 includes a shunt resistor R0. The shunt resistor R0 is a resistor disposed on the ground line 30 to detect a magnitude of an electric current flowing through the ground line 30. The shunt resistor R0 includes a first end that is connected to the motor driver 21. The shunt resistor R0 includes a second end that is grounded.

The control unit 20 includes an electric current measurement circuit 23. In the first embodiment, the electric current measurement circuit 23 is in a form of a differential amplification circuit. More specifically, the electric current measurement circuit 23 includes first to fourth resistors R1 to R4 and a first operational amplifier A1.

The first resistor R1 includes a first end that is connected to the first end of the shunt resistor R0. The first resistor R1 includes a second end that is connected to a non-inverting input terminal of the first operational amplifier A1.

The second resistor R2 includes a first end that is connected to the second end of the shunt resistor R0. The second resistor R2 includes a second end that is connected to an inverting input terminal of the first operational amplifier A1.

The third resistor R3 includes a first end that is connected to the inverting input terminal of the first operational amplifier A1. The third resistor R3 includes a second end that is connected to an output terminal of the first operational amplifier A1.

The fourth resistor R4 includes a first end that is connected to the non-inverting input terminal of the first operational amplifier A1. The fourth resistor R4 includes a second end that is connected to the reference voltage circuit 24.

The resistor R1 and the resistor R2 have equal resistance values. The resistor R3 and the resistor R4 have equal resistance values. In the first embodiment, the resistance values of the resistors R1, R3 are 10 kΩ or less. Such resistance values make it possible to avoid influences of stray capacitance (or parasitic capacitance) on rapid change of input signals. Consequently, the electric current measurement circuit 23 can accurately output an output voltage $V_{out}$.

The output terminal of the first operational amplifier A1 is connected to an input port P1 of the control circuit 22 via an eleventh resistor R11, the input port P1 being provided with an analog-digital (A/D) converter. Analog signals received at the input port P1 are converted into digital signals.

The electric current measurement circuit 23 outputs the output voltage $V_{out}$ determined by Formula (1) shown below from the output terminal of the first operational amplifier A1.

$$V_{out}=(V_1-V_2)\times(R_3/R_1)+V_{ref} \qquad \text{Formula (1)}$$

In Formula (1), $V_1$ represents a voltage value at the first end of the first resistor R1. $V_2$ represents a voltage value at the first end of the second resistor R2. That is, ($V_1$-$V_2$) represents a voltage (a measured voltage) across the shunt resistor R0. $R_1$ represents a resistance value of the first resistor R1. $R_3$ represents a resistance value of the third resistor R3. $V_{ref}$ represents a voltage value of the reference voltage output from the reference voltage circuit 24.

That is, the electric current measurement circuit 23 is configured to output the output voltage $V_{out}$, which corresponds to a sum of (i) the reference voltage received and (ii) the measured voltage amplified. In the first embodiment, the electric current measurement circuit 23 has a gain $G_1$ (specifically, $R_3/R_1$) below 20. The gain $G_1$ below 20 enables the first operational amplifier A1 to reproduce an input waveform. The gain $G_1$ may be greater than an open-loop gain at a speed of the change in the input signal of the first operational amplifier A1 so as to respond to a rapid change in the input signal, although the first operational amplifier A1 may not be able to reproduce the input waveform.

The electric current measurement circuit 23 is not limited to a differential amplification circuit in the above-described form, but may include a transistor(s) in addition to or instead of the first operational amplifier A1 in another embodiment. In yet another embodiment, the electric current measurement circuit 23 may be in a form of an amplification circuit other than a differential amplification circuit, or may be configured so as not to amplify the measured voltage.

The reference voltage circuit 24 includes: a fifth resistor R5; a sixth resistor R6; a first transistor T1; and a reference voltage output terminal 24a.

The fifth resistor R5 includes a first end to receive a supply voltage. The supply voltage may be any DC voltage, and may be, for example, a DC voltage of 5 [V]. The fifth resistor R5 includes a second end that is connected to a first end of the sixth resistor R6. The reference voltage is generated at a connection point (or, a node) between the fifth resistor R5 and the sixth resistor R6. The sixth resistor R6 includes a second end that is grounded. In the first embodiment, the fifth resistor R5 and the sixth resistor R6 have equal (or equivalent) resistance values.

The reference voltage output terminal 24a is connected to the connection point between the fifth resistor R5 and the sixth resistor R6. The reference voltage output terminal 24a is configured to output a reference voltage.

The first transistor T1 is in a form of a PNP-type bipolar transistor, in the first embodiment. The first transistor T1 is not limited to the PNP-type bipolar transistor, but may be in a form of another type of transistor in another embodiment. The first transistor T1 may be replaced with another type of switching device such as an FET or an IGBT. The first transistor T1 includes a base that is connected to an output port P2 of the control circuit 22. The first transistor T1 includes an emitter to receive the supply voltage. The first transistor T1 includes a collector that is connected to the connection point between the fifth resistor R5 and the sixth resistor R6.

In another embodiment, the collector of the first transistor T1 may be connected to the connection point between the fifth resistor R5 and the sixth resistor R6 via an additional resistor. In this case, the reference voltage when the first transistor T1 is turned on can be set to any value depending on a resistance value of the additional resistor. The value of the reference voltage may be set greater than an overcurrent detection threshold of the overcurrent detection circuit 25 that is set by a seventh resistor R7 and an eighth resistor R8, which are described later. The overcurrent detection threshold is a value to determine whether an overcurrent is flowing through the motor 11. In this case, the overcurrent detection circuit 25, which will be detailed later, can be operated in response to the first transistor T1 being turned on. In other words, the overcurrent detection circuit 25 can be operated in response to an electric current flowing through the shunt resistor R0, the electric current corresponding to the voltage value that is set.

The resistance value of the first resistor R1 may be set to a value much greater than the resistance value of each of the fifth resistor R5 and the sixth resistor R6 (i.e. Resistance Value of the First Resistor R1»Resistance Value of the Fifth Resistor R5; and Resistance Value of the First Resistor R1»Resistance Value of the Sixth Resistor R6). An output impedance of the reference voltage circuit 24 may be set to be at least equal to or less than one tenth of the resistance value of the resistor R1. In this case, an influence caused by the output impedance on the electric current measurement circuit 23 may be reduced.

The reference voltage circuit 24 outputs a reference voltage $V_{ref}$ having a first value Va in response to the first transistor T1 being turned off. The first value Va may be any value, for example, 2.5 [V]. The reference voltage circuit 24 outputs a reference voltage $V_{ref}$ having a second value Vb in response to the first transistor T1 being turned on. The second value Vb may be any value, for example, 5.0 [V].

The overcurrent detection circuit 25 includes: seventh to tenth resistors R7 to R10; first to second capacitors C1 to C2; and a comparator A2.

The seventh resistor R7 includes a first end to receive the supply voltage. The seventh resistor R7 includes a second end that is connected to a first end of the eighth resistor R8 and an inverting input terminal of the comparator A2. The eighth resistor R8 includes a second end that is grounded.

The ninth resistor R9 includes a first end that is connected to the output terminal of the first operational amplifier A1. The ninth resistor R9 includes a second end that is connected to a non-inverting input terminal of the comparator A2.

The tenth resistor R10 includes a first end that is connected to the latch circuit 26. The tenth resistor R10 includes a second end that is connected to the non-inverting input terminal of the comparator A2.

The first capacitor C1 includes a first end to receive the supply voltage. The first capacitor C1 includes a second end that is connected to the inverting input terminal of the comparator A2. The second capacitor C2 includes a first end that is connected to the non-inverting input terminal of the comparator A2. The second capacitor C2 includes a second end that is grounded.

The ninth resistor R9 and the second capacitor C2 form a first low-pass filter that is connected to the non-inverting input terminal of the comparator A2.

The first capacitor C1 forms a second low-pass filter that is connected to the inverting input terminal of the comparator A2. The first capacitor C1 and the second capacitor C2 can maintain a logic level of an output of the comparator A2 LOW in response to the supply voltage being applied.

The first low-pass filter may have a time constant of 1[μs] or less. With such time constant, the overcurrent detection circuit 25 may achieve a high response speed. The time constant of the first low-pass filter corresponds to a product of a resistance value of the ninth resistor R9 and an electrostatic capacitance of the second capacitor C2.

In the overcurrent detection circuit 25, the comparator A2 outputs an overcurrent signal from the output terminal in response to a voltage of the non-inverting input terminal (that is, a voltage of the output terminal of the first operational amplifier A1) being greater than a voltage of the inverting input terminal. The overcurrent signal is a signal having a high level (that is, logical HIGH). The overcurrent signal indicates that the overcurrent detection circuit 25 is detecting the overcurrent. In other words, the value of the voltage received by the inverting input terminal of the comparator A2 corresponds to (or is used as) the overcurrent detection threshold.

The latch circuit 26 includes a second transistor T2 and a third transistor T3. The second transistor T2 is in a form of a PNP-type bipolar transistor in the first embodiment. The second transistor T2 is not limited to the PNP-type bipolar transistor, but may be in a form of another type of transistor in another embodiment. The second transistor T2 may be replaced with, for example, another type of switching element such as an FET or an IGBT.

The second transistor T2 includes a base that is connected to a collector of the third transistor T3.

The second transistor T2 includes an emitter that is connected to a cathode of a first diode D1 and a cathode of a second diode D2. The first diode D1 includes an anode that is connected to an output port P3 of the control circuit 22. The second diode D2 includes an anode that is connected to the switch manipulation circuit 27.

The second transistor T2 includes a collector that is connected to the non-inverting input terminal of the comparator A2 via the tenth resistor R10.

The third transistor T3 is in a form of an NPN-type bipolar transistor in the first embodiment. The third transistor T3 is not limited to an NPN-type bipolar transistor, but may be in a form of another type of transistor in another embodiment. The third transistor T3 may be replaced with another type of switching device such as an FET or an IGBT.

The third transistor T3 includes a base that is connected to an output terminal of the comparator A2. The third transistor T3 includes an emitter that is grounded. The collector of the third transistor T3 is connected to an input port P4 of the control circuit 22.

In the latch circuit 26, the second transistor T2 and the third transistor T3 are turned on in response to a latching condition being established. The latching condition is established in response to (i) a logic level of the output port P3 of the control circuit 22 being set HIGH (or a logical HIGH being output from the switch manipulation circuit 27), and (ii) an overcurrent signal being output from the output terminal of the comparator A2. A logic level of the non-inverting input terminal of the comparator A2 is pulled up to HIGH via the tenth resistor R10 in response to the second transistor T2 and the third transistor T3 being turned on. Although the voltage value of the signal output from the output terminal of the first operational amplifier A1 drops afterward, the logic level of the non-inverting input terminal of the comparator A2 is kept pulled up to HIGH. Thus, the output of the comparator A2 remains unchanged, and the second transistor T2 and the third transistor T3 are kept turned on. The second transistor T2 and the third transistor T3 are kept turned on (i) until the trigger switch 9 switches from ON to OFF, or (ii) until the logic level of the output port P3 of the control circuit 22 switches from HIGH to LOW.

The switch manipulation circuit 27 includes a fourth transistor T4.

The fourth transistor T4 is in a form of a PNP-type bipolar transistor in the first embodiment. The fourth transistor T4 is not limited to the PNP-type bipolar transistor, but may be in a form of another type of transistor in another embodiment. The fourth transistor T4 may be replaced with another type of switching device such as an FET or an IGBT. The fourth transistor T4 includes a base that is connected to the trigger switch 9. The fourth transistor T4 includes an emitter to receive the supply voltage. The fourth transistor T4 includes a collector that is connected to the anode of the second diode D2 and an input port P5 of the control circuit 22.

In the switch manipulation circuit 27, the base of the fourth transistor T4 has a ground potential (that is, zero volts [V]) in response to the trigger switch 9 switching from OFF to ON. Consequently, the fourth transistor T4 is turned on. This enables the switch manipulation circuit 27 to output the supply voltage.

The overcurrent interruption circuit 28 is disposed on a power supply line 29. The overcurrent interruption circuit 28 is configured to receive an overcurrent control signal. The overcurrent control signal is a two-valued logic signal (i.e. a binary logic signal). The overcurrent interruption circuit 28 is configured to switch between a conductive state and a non-conductive state depending on a logic level of the overcurrent control signal. The overcurrent interruption circuit 28 in the conductive state conducts the power supply line 29. The overcurrent interruption circuit 28 in the non-conductive state interrupts the power supply line 29. The logic level of the overcurrent control signal corresponds to a logic level of the collector of the third transistor T3.

The overcurrent interruption circuit 28 switches to the conductive state in response to the logic level of the overcurrent control signal being HIGH. The overcurrent interruption circuit 28 switches to the non-conductive state in response to the logic level of the overcurrent control signal being LOW.

[1-3. Work Machine Controlling Process]

Descriptions are given below of steps of a work machine controlling process performed by the CPU 22a. The work machine controlling process is initiated after the supply voltage is supplied to the control circuit 22 and the control circuit 22 is started.

Figure 3:
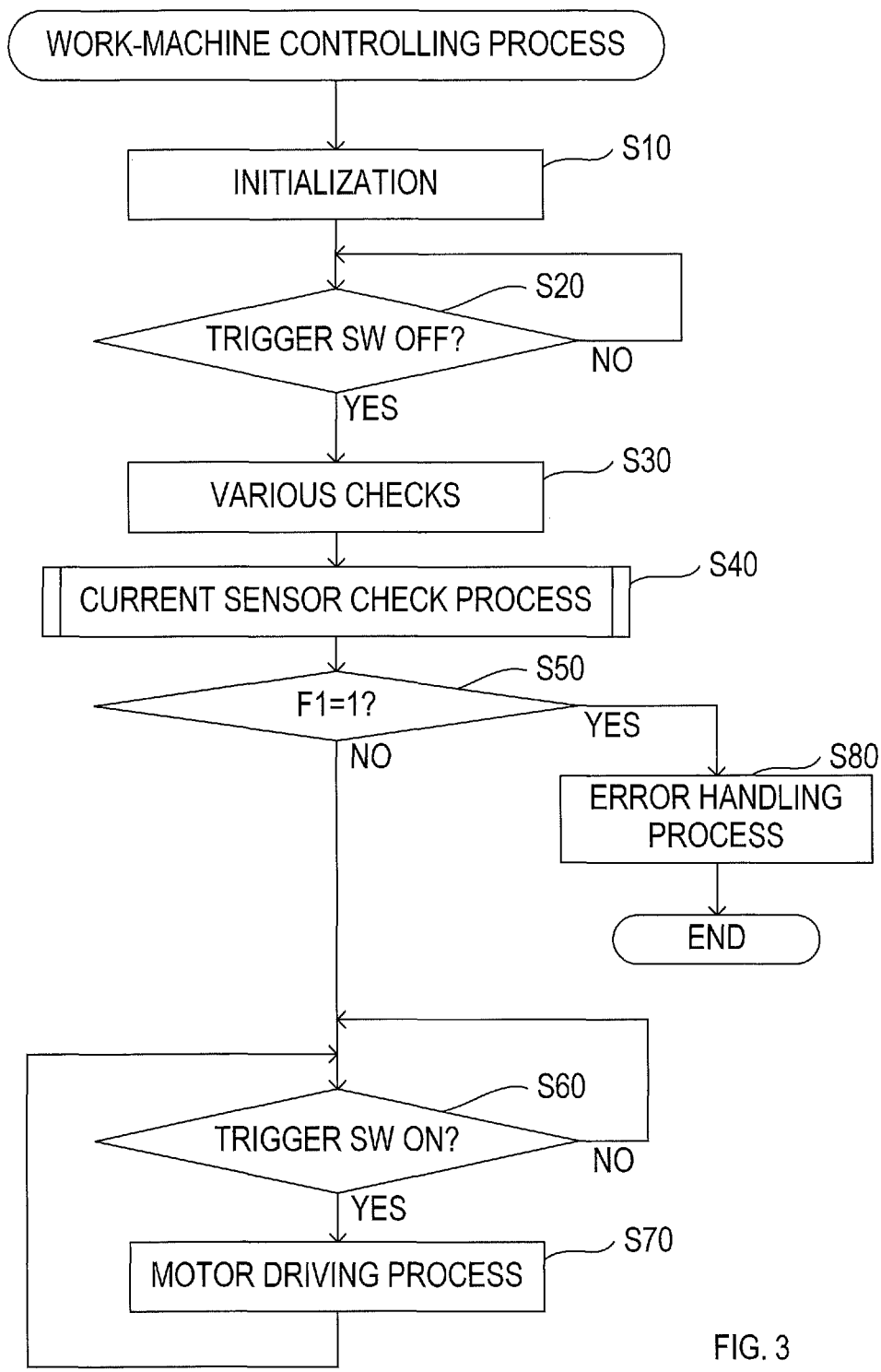
FIG. 3 is a flowchart showing a work machine controlling process.

As shown in FIG. 3, upon the initiation of the work machine controlling process, the CPU 22a first performs an initialization in S10, in which various parameters used in the work machine controlling process are set to initial values.

The CPU 22a then determines in S20 whether the trigger switch 9 is turned off. Specifically, the CPU 22a determines that the trigger switch 9 is turned on in response to a logic level of input port P5 being HIGH. The CPU 22a determines that the trigger switch 9 is turned off in response to the logic level of input port P5 being LOW.

In a case where the trigger switch 9 is turned on, the CPU 22a waits for the trigger switch 9 to be turned off by repeatedly performing the step of S20.

In response to the trigger switch 9 being turned off, the CPU 22a performs various checks in S30. For example, the CPU 22a checks a voltage on the battery 12 and a temperature on the switching elements of the motor driver 21.

The CPU 22a then performs, in S40, a current sensor check process, which will be described later.

Upon completion of the current sensor check process, the CPU 22a determines in S50 whether a current sensor error flag F1, which will be described later, is set. In the description herein below, setting the current sensor error flag F1 indicates setting the value of the current sensor error flag F1 to "one". Clearing the current sensor error flag F1 indicates setting the value of the current sensor error flag F1 to "zero". In a case where the current sensor error flag F1 is cleared (F1=0), the CPU 22a determines in S60 whether the trigger switch 9 is turned on. In a case where the trigger switch 9 is turned off, the CPU 22a waits for the trigger switch 9 to be turned on by repeatedly performing the step of S60.

In response to the trigger switch 9 being turned on, the CPU 22a performs a motor driving process to drive the motor 11 in S70, and the process proceeds to S60.

In a case where the current sensor error flag F1 is set in S50, the CPU 22a performs a specified error handling process in S80, and then finishes the work machine controlling process.

Figure 4:
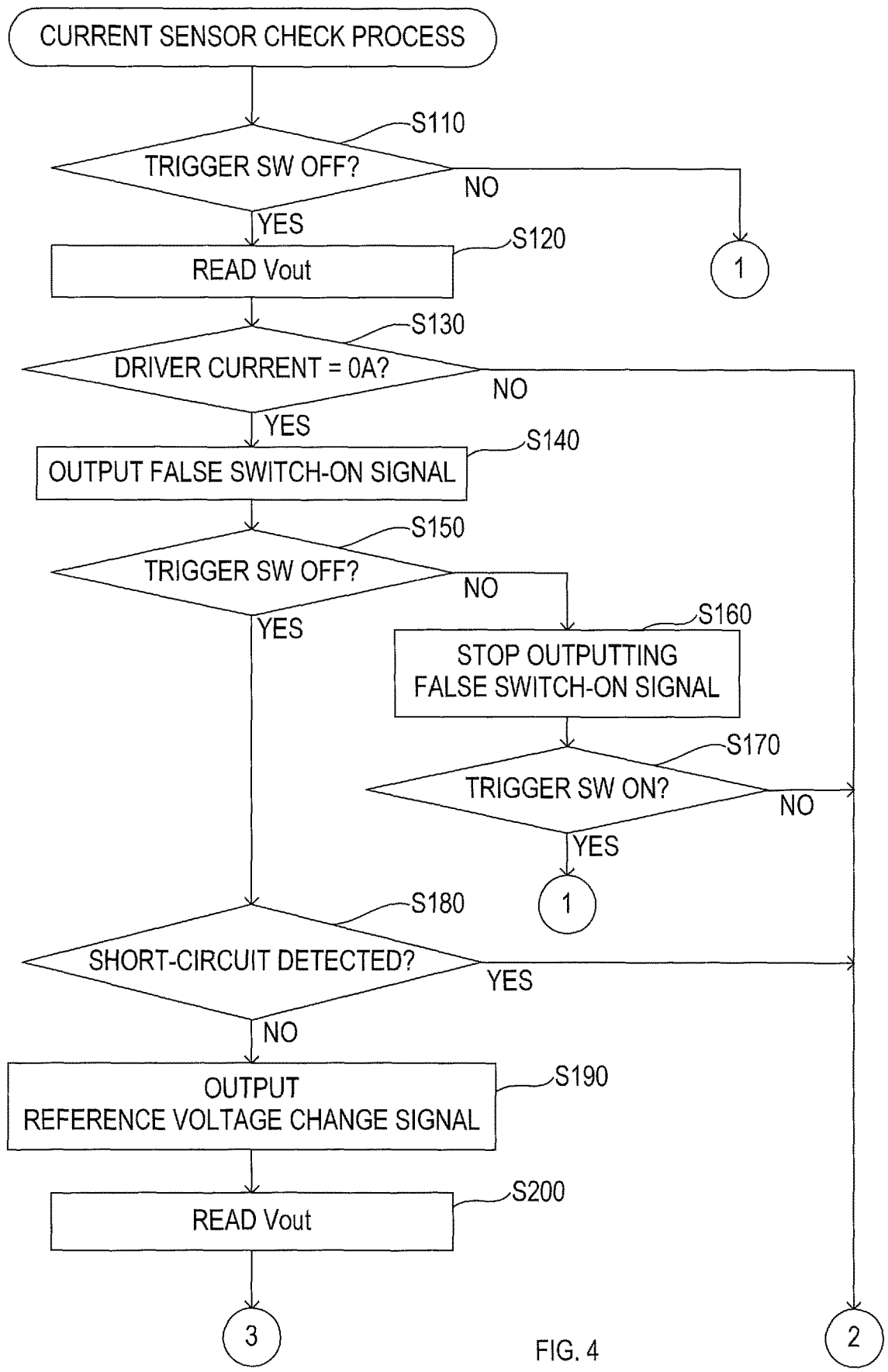
FIG. 4 is a flowchart showing a first half of a current sensor check process.

Descriptions are given below of steps of the current sensor check process performed by the CPU 22a in S40 with reference to FIG. 4.

The CPU 22a first determines in S110 whether the trigger switch 9 is turned off in response to the current sensor check process being initiated. In a case where the trigger switch 9 is turned on, the CPU 22a finishes the current sensor check process. In a case where the trigger switch 9 is turned off, the CPU 22a reads in S120 the output voltage $V_{out}$ output from the electric current measurement circuit 23.

In S130, the CPU 22a determines whether a driver current value is zero amperes ([A]) based on the read output voltage $V_{out}$. Specifically, the CPU 22a determines that the driver current value is 0 [A] in a case where the output voltage $V_{out}$ is within a preset normal voltage range (or a preset nominal voltage range). The CPU 22a determines that the driver current value is not 0 [A] in a case where the output voltage $V_{out}$ is not within the normal voltage range. In the first embodiment, the normal voltage range is from a preset lower limit and to a preset upper limit. The lower limit may be any voltage value, for example, 2.4 [V]. The upper limit may be any voltage value greater than the lower limit, for example, 2.6 [V].

In a case where the driver current value is not 0 [A], the CPU 22a proceeds the process to S280. In a case where the driver current value is 0 [A], the CPU 22a outputs a simulative switch-on signal in S140. Specifically, the CPU 22a sets the logic level of the output port P3 to HIGH.

Subsequently, the CPU 22a determines in S150 whether the trigger switch 9 is turned off. In a case where the trigger switch 9 is turned on, the CPU 22a stops outputting the simulative switch-on signal in S160. Specifically, the CPU 22a sets the logic level of the output port P3 to LOW.

The CPU 22a determines in S170 whether the trigger switch 9 is turned on. In a case where the trigger switch 9 is turned on, the CPU 22a finishes the current sensor check process. In a case where the trigger switch 9 is turned off, the CPU 22a proceeds the process to S280.

In a case where the trigger switch 9 is turned off in S150, the CPU 22a determines in S180 whether the overcurrent is detected. Specifically, in a case where a logic level of the input port P4 is LOW, the CPU 22a determines that the overcurrent is detected.

In a case where the overcurrent is detected, the CPU 22a proceeds the process to S280. In a case where the overcurrent is not detected, the CPU 22a outputs a reference voltage varying signal in S190. Specifically, the CPU 22a sets a logic level of the output port P2 to LOW.

Figure 5:
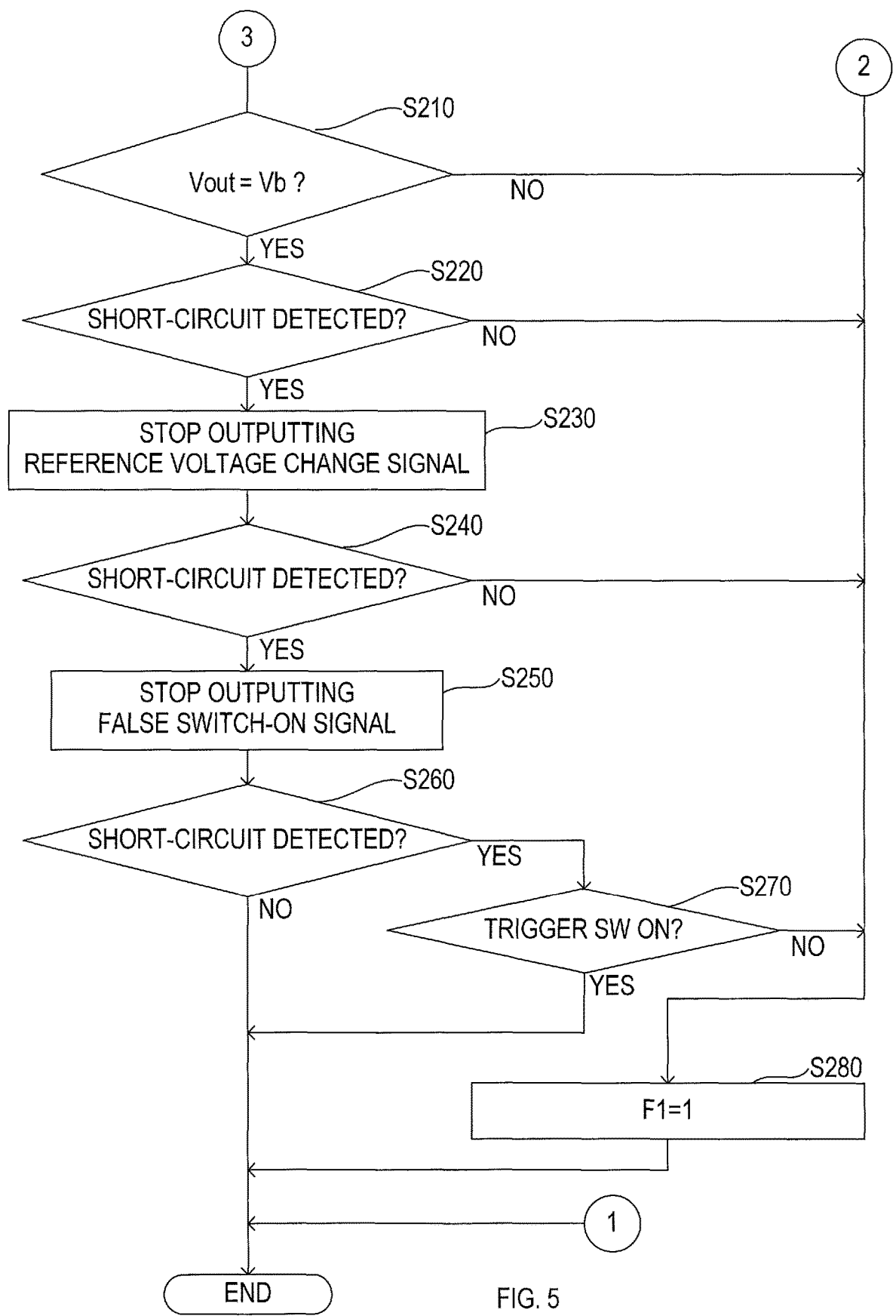
FIG. 5 is a flowchart showing a second half of the current sensor check process.

The CPU 22a reads the output voltage $V_{out}$ in S200. As shown in FIG. 5, the CPU 22a determines in S210 whether a value of the read output voltage $V_{out}$ is equal to the second value Vb.

In a case where the value of the output voltage $V_{out}$ is not equal to the second value Vb, the CPU 22a proceeds the process to S280. In a case where the value of the output voltage $V_{out}$ is equal to the second value Vb, the CPU 22a determines in S220 whether the overcurrent is detected in a similar manner to S180.

In a case where the overcurrent is not detected, the CPU 22a proceeds the process to S280. In a case where the overcurrent is detected, the CPU 22a stops outputting the reference voltage varying signal in S230. Specifically, the CPU 22a sets the logic level of the output port P2 to HIGH.

Subsequently, the CPU 22a determines in S240 whether the overcurrent is detected in a similar manner to S180. In a case where the overcurrent is not detected, the CPU 22a proceeds the process to S280. In a case where the overcurrent is detected, the CPU 22a stops outputting the simulative switch-on signal in S250. Specifically, the CPU 22a sets the logic level of the output port P3 to LOW.

The CPU 22a determines in S260 whether the overcurrent is detected in a similar manner to S180. In a case where the overcurrent is not detected, the CPU 22a finishes the current sensor check process. In a case where the overcurrent is detected, the CPU 22a determines in S270 whether the trigger switch 9 is turned on. In a case where the trigger switch 9 is turned on, the CPU 22a finishes the current sensor check process. In a case where the trigger switch 9 is turned off, the CPU 22a proceeds the process to S280.

In S280, the CPU 22a sets the current sensor error flag F1 to finish the current sensor check process. The current sensor error flag F1 is provided in the RAM 22c.

Figure 6:
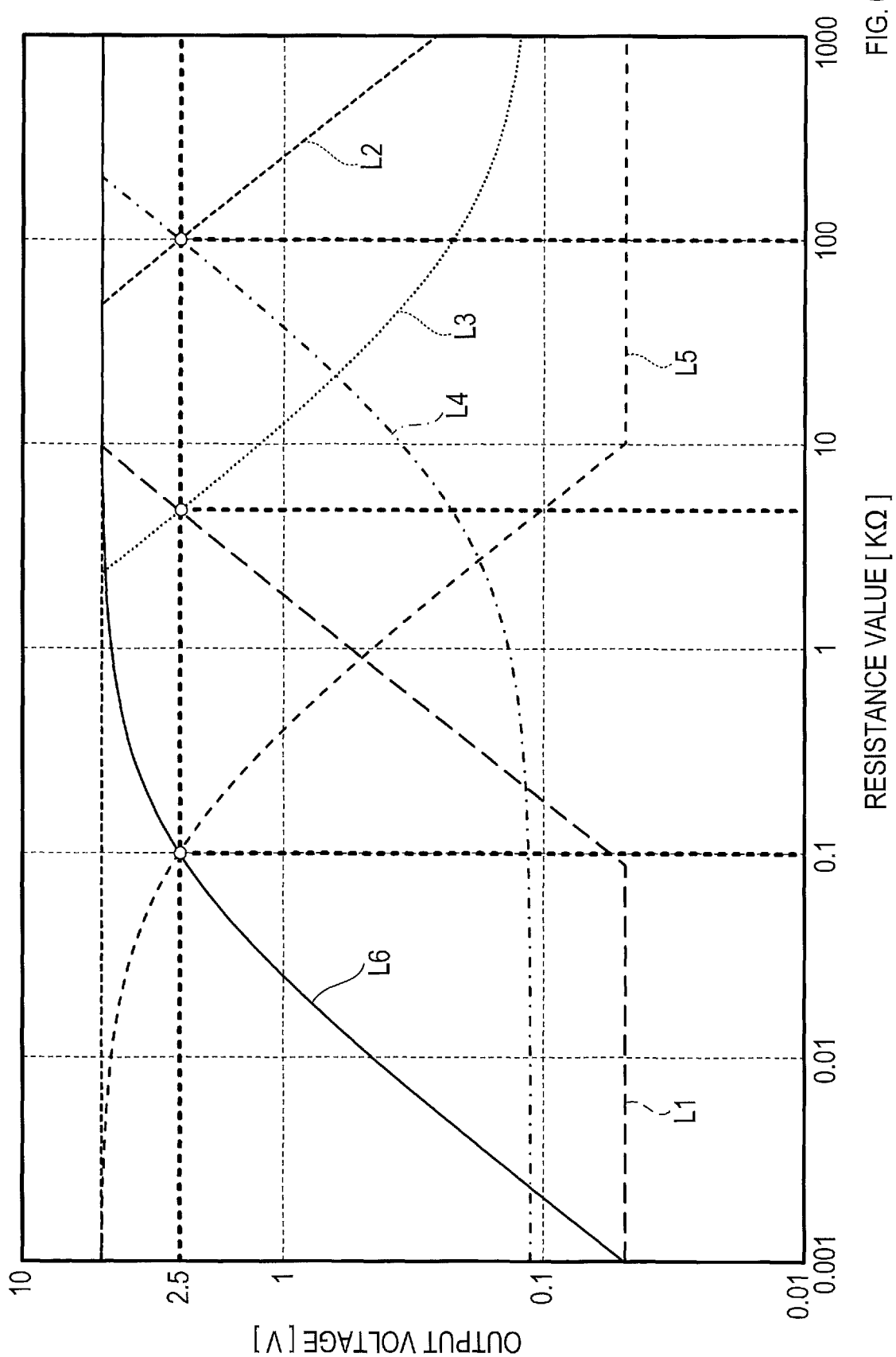
FIG. 6 is a graph showing changes in output voltages relative to changes in resistance values.

FIG. 6 shows changes in the output voltages $V_{out}$ relative to changes in the resistance values of the first to the sixth resistors R1 to R6 when the driver current value is 0 [A]. Lines L1 to L6 indicate the change in the output voltage $V_{out}$ relative to the change in the resistance values of the first to the sixth resistors R1 to R6, respectively.

The resistance value of the first resistor R1 may be different from the resistance value of the second resistor R2. The resistance value of the third resistor R3 may be different from the resistance value of the fourth resistor R4.

In this case, examples of appropriate resistance values of the first to the sixth resistors R1 to R6 can be 4.7 kΩ, 100 kΩ, 4.7 kΩ, 100 kΩ, 100Ω, and 100Ω, respectively.

As shown in FIG. 6, in response to a change in the resistance value of one of the first to the sixth resistors R1 to R6 when the driver current value is 0 [A], the output voltage $V_{out}$ deviates from the first value Va (−2.5 [V]). Thus, the normal voltage range is specified to be from the lower limit (2.4 [V]) to the upper limit (2.6 [V]).

[1-4. Summary of First Embodiment]

To summarize the first embodiment, the electric current measurement circuit 23 measures the magnitude of the electric current flowing through the shunt resistor R0, and outputs the output voltage $V_{out}$ corresponding to the magnitude of the measured electric current. The reference voltage circuit 24 supplies the electric current measurement circuit 23 with the reference voltage $V_{ref}$, the value of which has been set to be different from 0 [V].

The electric current measurement circuit 23 outputs the output voltage $V_{out}$ that is consistent with the reference voltage in response to the electric current not flowing through the shunt resistor R0. The reference voltage circuit 24 varies the value of the reference voltage $V_{ref}$ in response to a first condition being established, the first condition being a condition in which the trigger switch is OFF immediately after the control circuit 22 is started. The first condition is not limited to the condition in which the trigger switch is OFF immediately after the control circuit 22 is started, but may be any other condition.

As described above, in the electric powered work machine 1, the reference voltage circuit 24 varies the value of the reference voltage $V_{ref}$ in response to the first condition being established. The value of the output voltage $V_{out}$ of the electric current measurement circuit 23 varies as the value of the reference voltage $V_{ref}$ varies (or the value of the output voltage $V_{out}$ of the electric current measurement circuit 23 varies in accordance with the value of the reference voltage $V_{ref}$ varying), and therefore the electric current measurement circuit 23 can be determined non-faulty. Thus, the electric powered work machine 1 can measure the electric current with high reliability without an additional electric current measurement circuit. Furthermore, a circuit for varying the reference voltage $V_{ref}$ in the reference voltage circuit 24 can be simplified.

As a result, the electric powered work machine 1 does not require additional components for the additional electric current measurement circuit and an increased footprint for the additional components therein.

The value of the output voltage $V_{out}$ during the first condition being established is greater than the value of the output voltage $V_{out}$ during the first condition not being established. This enables the electric current measurement circuit 23 to output the output voltage $V_{out}$, which is greater than the measured voltage generated across the shunt resistor R0, even in a case where the reference voltage $V_{ref}$ is varied due to some cause, such as a noise, during the motor 11 rotating.

This makes it possible to suppress an inaccurate measurement in which the current value is measured lower than the actual value in the electric powered work machine 1, in a case where a faulty occurs during the motor 11 rotating. The faulty can be a variation in the reference voltage $V_{ref}$ during the motor 11 rotating.

In a case where the output voltage $V_{out}$ is greater than the overcurrent detection threshold, the overcurrent detection circuit 25 determines that an overcurrent is flowing through the shunt resistor R0. The reference voltage $V_{ref}$ during the first condition being established is greater than the overcurrent detection threshold.

Thus, the output voltage $V_{out}$ of the electric current measurement circuit 23 becomes greater than the overcurrent detection threshold as the reference voltage circuit 24 varies the value of the reference voltage $V_{ref}$ in response to the first condition being established. Consequently, the overcurrent detection circuit 25 determines that the overcurrent is detected. Thus, the electric powered work machine 1 can perform a first diagnosis of the electric current measurement circuit 23 (in other words, a determination on whether the electric current measurement circuit 23 properly operates) and a second diagnosis of the overcurrent detection circuit 25 (in other words, a determination on whether the overcurrent detection circuit 25 properly operates) simultaneously, by changing the value of the reference voltage $V_{ref}$.

The control circuit 22 performs a self-diagnosis, based on the output voltage $V_{out}$ during the first condition being established, to determine whether a faulty occurs in the electric current measurement circuit 23. The first condition is established in response to the trigger switch 9 not being manually operated. The control circuit 22 suspends the self-diagnosis in response to the trigger switch 9 being manually operated during the self-diagnosis.

This enables the electric powered work machine 1 to suppress occurrence of a trouble that the current measuring circuit 23 performs the self-diagnosis despite a situation where the self-diagnosis cannot be performed, and thus diagnosis accuracy for the current measuring circuit 23 can be improved.

[1-5. Correspondence Between Terms]

In the embodiment described above, the saw blade 4 corresponds to one example of the tool of the present disclosure, and the reference voltage circuit 24 corresponds to one example of the reference voltage generation circuit of the present disclosure.

The battery 12 corresponds to one example of the power supply of the present disclosure, the power supply line 29 and the ground line 30 correspond to one example of the electric current path of the present disclosure.

The control circuit 22 performing the steps of S210 corresponds to one example of the diagnosis circuit for electric current measurement and the diagnosis circuit for overcurrent detection of the present disclosure, and the trigger switch 9 corresponds to one example of the manual switch of the present disclosure. The control circuit 22 corresponds to one example of the computer of the present disclosure. The comparator A2 corresponds to one example of the signal output circuit of the present disclosure. The control circuit 22 corresponds to one example of the simulative signal output circuit of the present disclosure. The first transistor T1 corresponds to one example of the switch of the present disclosure.

[2] Other Embodiments

One embodiment of the present disclosure has been described in the above. However, the present disclosure is not limited to the above-described embodiment, but can be practiced in various modes.

[Variation 1]

Figure 7:
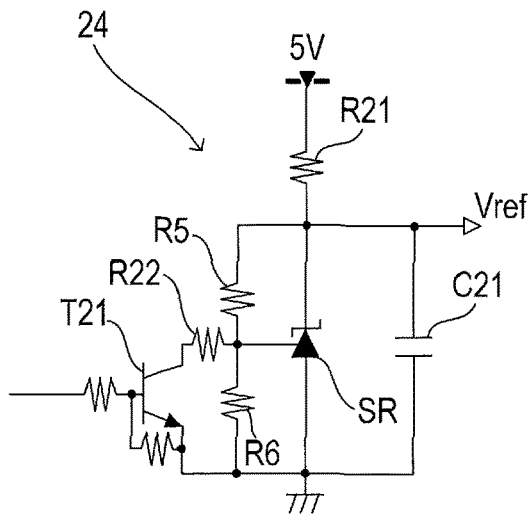
FIG. 7 is a circuit diagram of a reference voltage circuit including a shunt regulator.

As shown in FIG. 7, the reference voltage circuit 24 may include: the fifth resistor R5; the sixth resistor R6; a twenty-first resistor R21; a twenty-second resistor R22; a twenty-first capacitor C21; a twenty-first transistor T21; and a shunt regulator SR.

The twenty-first resistor R21 includes a first end to receive the supply voltage. The twenty-first resistor R21 includes a second end that is connected to the first end of the fifth resistor R5. The fifth resistor R5 includes the second end that is connected to the first end of the sixth resistor R6 and a first end of the twenty-second resistor R22. The sixth resistor R6 includes the second end that is grounded.

The twenty-first capacitor C21 includes a first end that is connected to a connection point between the twenty-first resistor R21 and the fifth resistor R5. The twenty-first capacitor C21 includes a second end that is grounded.

The twenty-first transistor T21 is an NPN-type bipolar transistor in the first variation. The twenty-first transistor T21 is not limited to the NPN-type bipolar transistor, but may be a transistor in another form in other embodiments. The twenty-first transistor T21 includes a base that is connected to the output port P2 of the control circuit 22. The twenty-first transistor T21 includes a collector that is connected to a second end of the twenty-second resistor R22. The twenty-first transistor T21 includes an emitter that is grounded.

The shunt regulator SR includes a cathode that is connected to the connection point between the twenty-first resistor R21 and the fifth resistor R5. The shunt regulator SR includes an anode that is grounded. The shunt regulator SR includes a reference terminal that is connected to the connection point between the fifth resistor R5 and the sixth resistor R6.

The reference voltage circuit 24 outputs a cathode voltage at a connection point between the twenty-first resistor R21 and the shunt regulator SR, as the reference voltage $V_{ref}$.

In the reference voltage circuit 24, the voltage at the connection point between the fifth resistor R5 and the sixth resistor R6 is input to the reference terminal of the shunt regulator SR. The shunt regulator SR generates a cathode voltage such that the voltage input to the reference terminal becomes a predetermined voltage, and outputs the generated cathode voltage as the reference voltage $V_{ref}$. The voltage input to the reference terminal while the twenty-first transistor T21 is turned on is determined depending on the resistance values of the fifth resistor R5, the sixth resistor R6, and the twenty-second resistor R22. The voltage input to the reference terminal while the twenty-first transistor T21 is turned off is determined depending on the resistance values of the fifth resistor R5 and the sixth resistor R6.

[Variation 2]

Figure 8:
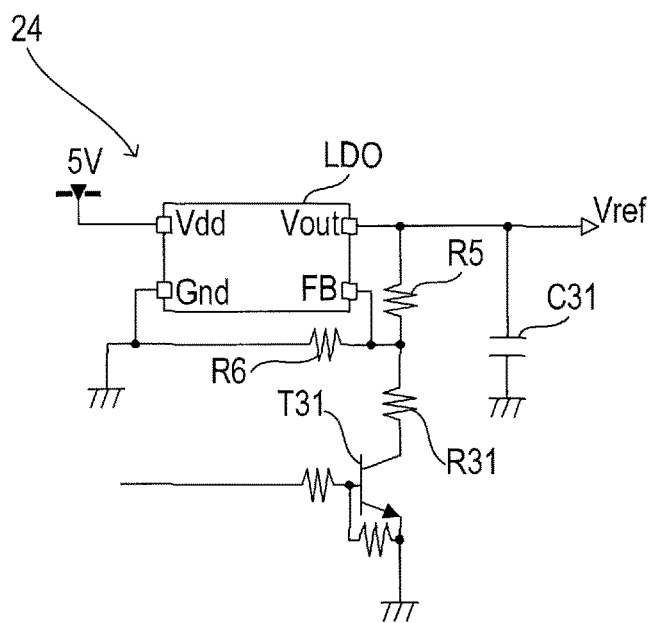
FIG. 8 is a circuit diagram of the reference voltage circuit including a linear regulator.

As shown in FIG. 8, the reference voltage circuit 24 may include: the fifth resistor R5; the sixth resistor R6; a thirty-first resistor R31; a thirty-first capacitor C31; a thirty-first transistor T31; and a variable output linear regulator LDO.

The fifth resistor R5 includes the first end that is connected to an output terminal $V_{out}$ of the variable output linear regulator LDO. The fifth resistor R5 includes the second end that is connected to the first end of the sixth resistor R6 and a first end of the thirty-first resistor R31. The sixth resistor R6 includes the second end that is grounded. The thirty-first resistor R31 includes a second end that is connected to a collector of the thirty-first transistor T31.

The thirty-first capacitor C31 includes a first end that is connected to the output terminal $V_{out}$ of the variable output linear regulator LDO. The thirty-first capacitor C31 includes a second end that is grounded.

The thirty-first transistor T31 is in a form of an NPN-type bipolar transistor in the second variation. The thirty-first transistor T31 is not limited to the NPN-type bipolar transistor, but may be in a form of another type of transistor in another embodiment. The thirty-first transistor T31 includes a base that is connected to the output port P2 of the control circuit 22. The thirty-first transistor T31 includes an emitter that is grounded.

The variable output linear regulator LDO includes an input terminal Vdd to receive the supply voltage. The variable output linear regulator LDO includes a feedback terminal FB that is connected to a connection point between the fifth resistor R5, the sixth resistor R6, and the thirty-first resistor R31. The variable output linear regulator LDO includes a ground terminal that is grounded.

In the reference voltage circuit 24 configured as described above, the thirty-first transistor T31 is turned on in response to the logic level of the output port P2 being HIGH. The reference voltage circuit 24 outputs, from the output terminal $V_{out}$, a voltage determined depending on the resistance values of the fifth resistor R5, the sixth resistor R6, and the thirty-first resistor R31 in response to the thirty-first transistor T31 being turned on. In the reference voltage circuit 24, the thirty-first transistor T31 is turned off in response to the logic level of the output port P2 being LOW. The reference voltage circuit 24 outputs, from the output terminal $V_{out}$, a voltage determined depending on the resistance values of the fifth resistor R5 and the sixth resistor R6 in response to the thirty-first transistor T31 being turned off.

[Variation 3]

Figure 9:
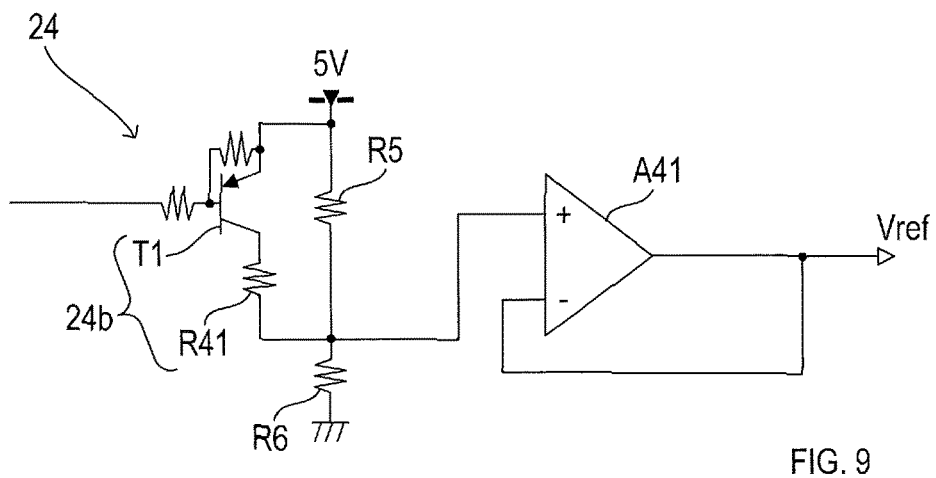
FIG. 9 is a circuit diagram of the reference voltage circuit including an operational amplifier.

As shown in FIG. 9, the reference voltage circuit 24 may include a resistance value varying circuit 24b and a second operational amplifier A41. The resistance value varying circuit 24b includes the first transistor T1 and a forty-first resistor R41.

The forty-first resistor R41 includes a first end that is connected to the collector of the first transistor T1. The forty-first resistor R41 includes a second end that is connected to the connection point between the fifth resistor R5 and the sixth resistor R6.

The second operational amplifier A41 includes a non-inverting input terminal that is connected to the connection point between the fifth resistor R5 and the sixth resistor R6. The second operational amplifier A41 includes an inverting input terminal that is connected to an output terminal of the second operational amplifier A41. That is, the second operational amplifier A41 forms a unity gain buffer (or, a voltage follower), which is one example of voltage buffers.

The reference voltage circuit 24 outputs a voltage equivalent to the voltage at the connection point between the fifth resistor R5 and the sixth resistor R6, as the reference voltage $V_{ref}$. The reference voltage circuit 24 can output, from the output terminal of the second operational amplifier A41, the reference voltage $V_{ref}$ at a low output impedance.

[fVariation 4]

The control circuit 22 may include the output port P2, as not shown in the drawings, instead of the reference voltage circuit 24 to output a signal converted from digital to analog (i.e. D/A conversion). In this case, the output port P2 may be connected to the non-inverting input terminal of the first operational amplifier A1 of electric current measurement circuit 23 via the fourth resistor R4. The reference voltage may be varied in response to the value of the voltage of the output port P2 varying to, for example, the first value Va or the second value Vb.

[Other Variations]

The technique of the present disclosure may be applied to various kinds of electric powered work machine used in work sites, such as do-it-yourself carpentry, manufacturing, gardening, and construction. Specifically, the technique of the present disclosure may be applied to various kinds of electric powered work machine, for example, electric power tools for stone processing, metal processing, or wood processing, working machines for gardening, and electric apparatuses for shaping the work-site environments. The present disclosure may be applied, more specifically, to various kinds of electric powered work machine, such as an electric hammer, an electric hammer drill, an electric drill, an electric screwdriver, an electric wrench, an electric grinder, an electric powered circular saw, an electric reciprocating saw, an electric jigsaw, an electric cutter, an electric chainsaw, an electric planer, an electric nail gun (including a tacker), an electric hedge trimmer, an electric lawn mower, an electric grass trimmer, an electric weed wacker, an electric cleaner, an electric blower, an electric sprayer, an electric spreader, and an electric dust collector.

A plurality of functions performed by a single element in the above-described embodiments may be achieved by a plurality of elements, or a function performed by a single element may be achieved by a plurality of elements. Also, a plurality of functions performed by a plurality of elements may be achieved by a single element, or a function performed by a plurality of elements may be achieved by a single element. Further, a part of a configuration in the above-described embodiments may be omitted. Moreover, at least a part of a configuration in the above-described embodiments may be added to, or may replace, another configuration in the above-described embodiments.

In addition to the electric powered work machine 1 described above, the technique of the present disclosure can also be implemented in various modes such as: a program for causing a computer to function as the control unit 20; a non-transitory tangible recording medium, such as a semiconductor memory, that stores the program; a method for controlling the electric powered work machine; and the like.

What is claimed is:

1. An electric powered circular saw comprising:
a circular saw-blade;
a battery including a positive electrode and a negative electrode;
a motor configured to generate a driving force to rotate the circular saw-blade;
a power line connected to the positive electrode;
a ground line connected to a ground, the ground being connected to the negative electrode;
a trigger switch configured to be turned on or off by a user of the electric powered circular saw;
a motor driver connected to the power line, to the ground, and also to the motor, the motor driver being configured (i) to electrically connect the motor to the power line and also to the ground line in response to the trigger switch being ON and (ii) to electrically disconnect the motor from the power line and also from the ground line in response to the trigger switch being OFF;
a shunt resistor on the ground line;
a control circuit configured to output a reference voltage varying signal in response to a voltage varying condition being established, the voltage varying condition being established with the trigger switch being OFF upon an activation of the control circuit;
a reference voltage generation circuit including a PNP transistor, the PNP transistor including a base connected to the control circuit, the PNP transistor being configured (i) to turn on in response to the base receiving the reference voltage varying signal from the control circuit and (ii) to turn off in response to the base not receiving the reference voltage varying signal, the reference voltage generation circuit being configured (i) to generate a reference voltage having a first magnitude in response to the PNP transistor being ON and (ii) to generate the reference voltage having a second magnitude in response to the PNP transistor being OFF, the first magnitude and the second magnitude being larger than zero volts, and the first magnitude being larger than the second magnitude; and an electric current measurement circuit including an operational amplifier, the electric current measurement circuit being configured (i) to receive the reference voltage and a measured voltage, (ii) to amplify the measured voltage with the operational amplifier, and (iii) to output a voltage sum from the operational amplifier, the measured voltage being generated across the shunt resistor in response to an electric current flowing through the shunt resistor, and the voltage sum corresponding to a sum of (i) the reference voltage received and (ii) the measured voltage amplified.

2. An electric powered work machine comprising:
a tool;
a motor configured to generate a driving force to drive the tool;
a manual switch configured to be manually operated by a user of the electric powered work machine;
an electric current path configured (i) to connect a power supply with the motor in response to the manual switch being manually operated and (ii) to disconnect the power supply from the motor in response to the manual switch not being manually operated;
a shunt resistor on the electric current path;
a reference voltage generation circuit configured (i) to generate a reference voltage having a first magnitude in response to a first condition being established, and (ii) to generate the reference voltage having a second magnitude in response to the first condition not being established, the first magnitude and the second magnitude being different from zero volts, and the first magnitude being different from the second magnitude; and
an electric current measurement circuit configured (i) to receive the reference voltage and a measured voltage, and (ii) to output an output voltage based on the reference voltage and the measured voltage, the measured voltage being generated across the shunt resistor in response to an electric current flowing through the shunt resistor, and the output voltage being consistent with the reference voltage in response to the electric current not flowing through the shunt resistor.

3. The electric powered work machine according to claim 2,
wherein the first magnitude is larger than the second magnitude.

4. The electric powered work machine according to claim 2, further comprising
a diagnosis circuit for electric current measurement that is configured to diagnose the electric current measurement circuit based on the output voltage during the first condition being established.

5. The electric powered work machine according to claim 4,
wherein the diagnosis circuit for electric current measurement is configured to:
determine the electric current measurement circuit non-faulty in response to a magnitude of the output voltage being consistent with the first magnitude, and
determine the electric current measurement circuit faulty in response to the magnitude of the output voltage being inconsistent with the first magnitude.

6. The electric powered work machine according to claim 4,
wherein the diagnosis circuit for electric current measurement is further configured to suspend diagnosing the electric current measurement circuit in response to the manual switch being manually operated during the diagnosis circuit for electric current measurement diagnosing the electric current measurement circuit.

7. The electric powered work machine according to claim 2, further comprising
an overcurrent detection circuit configured to detect an overcurrent flowing through the shunt resistor in response to the output voltage being equal to or greater than a preset threshold, the preset threshold corresponding to a minimum value of the output voltage as the overcurrent is flowing through the shunt resistor, and the preset threshold being smaller than the first magnitude.

8. The electric powered work machine according to claim 7,
wherein the overcurrent detection circuit includes:
a signal output circuit configured to output an overcurrent signal in response to the output voltage being equal to or greater than the preset threshold, the overcurrent signal indicating that the overcurrent detection circuit is detecting the overcurrent; and
a latch circuit configured to maintain the overcurrent signal output from the signal output circuit during the manual switch being manually operated.

9. The electric powered work machine according to claim 8, further comprising
a simulative signal output circuit configured to output a simulative switch-on signal to the latch circuit in response to the overcurrent detection circuit detecting the overcurrent, the simulative switch-on signal simulatively indicating the manual switch being manually operated.

10. The electric powered work machine according to claim 7, further comprising,
a diagnosis circuit for overcurrent detection that is configured to diagnose the overcurrent detection circuit during the first condition being established.

11. The electric powered work machine according to claim 10,
wherein the diagnosis circuit for overcurrent detection is configured to:
output a simulative voltage to the overcurrent detection circuit, the simulative voltage being greater than the preset threshold, and
determine whether the overcurrent detection circuit detects the overcurrent in response to the simulative voltage being output.

12. The electric powered work machine according to claim 2,
wherein the electric current measurement circuit is further configured to amplify the measured voltage received by the electric current measurement circuit.

13. The electric powered work machine according to claim 12,
wherein the electric current measurement circuit includes a differential amplification circuit configured to amplify the measured voltage received by the electric current measurement circuit.

14. The electric powered work machine according to claim 13,
wherein the differential amplification circuit includes an operational amplifier.

15. The electric powered work machine according to claim 14,
wherein the differential amplification circuit has a first gain,
wherein the operational amplifier has an open-loop gain thereof, and
wherein the first gain is smaller than the open-loop gain.

16. The electric powered work machine according to claim 12,
wherein the output voltage corresponds to a sum of (i) the reference voltage received by the electric current measurement circuit and (ii) the measured voltage amplified by the electric current measurement circuit.

17. The electric powered work machine according to claim 2,
wherein the reference voltage generation circuit includes:
a first resistor;
a second resistor connected in series with the first resistor;
a reference voltage output terminal connected between the first resistor and the second resistor, the reference voltage output terminal being configured to output the reference voltage; and
a switch connected in parallel with the first resistor, the switch being configured (i) to shift to a non-conductive state in response to the first condition not being established, and (ii) to shift to a conductive state in response to the first condition being established.

18. The electric powered work machine according to claim 2, further comprising
a computer including an output port, the output port being configured to output an analog-formed voltage signal to the reference voltage generation circuit, the analog-formed voltage signal having a first level or a second level, the first level being different from the second level, and the computer being configured (i) to set the analog-formed voltage signal to the first level in response to the first condition not being established, and (ii) to set the analog-formed voltage signal to the second level in response to the first condition being established.

19. The electric powered work machine according to claim 2,
wherein the first condition is established at least in response to the manual switch not being manually operated.

20. A method comprising:
conducting an electric current path in response to a manual switch of an electric powered work machine being manually operated, the electric current path connecting a power supply with a motor of the electric powered work machine;
interrupting the electric current path in response to the manual switch not being manually operated;
generating a reference voltage having a first magnitude in response to a first condition being established, the first magnitude being different from zero volts;
generating the reference voltage having a second magnitude in response to the first condition not being established, the second magnitude (i) being different from zero volts and (ii) being different from the first magnitude; and
outputting an output voltage based on the reference voltage and a measured voltage, the measured voltage being generated across a shunt resistor on the electric path in response to an electric current flowing through the shunt resistor, and the output voltage being consistent with the reference voltage in response to the electric current not flowing through the shunt resistor.

* * * * *